United States Patent
Adams

(10) Patent No.: US 7,472,207 B2
(45) Date of Patent: *Dec. 30, 2008

(54) OPTIMIZED-INCREMENTING, TIME-GAP DEFECT DETECTION APPARATUS AND METHOD

(75) Inventor: Phillip M. Adams, Henderson, NV (US)

(73) Assignee: AFTG-TG, L.L.C., Salt Lake City, UT (US)

( * ) Notice: Subject to any disclaimer, the term of this patent is extended or adjusted under 35 U.S.C. 154(b) by 531 days.

This patent is subject to a terminal disclaimer.

(21) Appl. No.: 11/154,087

(22) Filed: Jun. 15, 2005

(65) Prior Publication Data

US 2005/0257101 A1  Nov. 17, 2005

Related U.S. Application Data

(63) Continuation-in-part of application No. 10/715,340, filed on Nov. 17, 2003, now Pat. No. 7,249,203, which is a continuation of application No. 09/974,440, filed on Oct. 9, 2001, now Pat. No. 6,691,181.

(51) Int. Cl.
*G06F 13/28* (2006.01)

(52) U.S. Cl. .............................. 710/25; 714/48; 714/52; 714/815

(58) Field of Classification Search ................. 714/815; 710/25
See application file for complete search history.

(56) References Cited

U.S. PATENT DOCUMENTS

| | | | |
|---|---|---|---|
| 3,908,099 A | 9/1975 | Borbas et al. | |
| 4,053,926 A * | 10/1977 | Lemoine et al. | 386/14 |
| 4,459,661 A | 7/1984 | Kaneda et al. | |
| 4,589,063 A | 5/1986 | Shah et al. | |
| 4,654,783 A | 3/1987 | Veres et al. | |
| 4,727,480 A | 2/1988 | Albright et al. | |
| 4,745,604 A * | 5/1988 | Patel et al. | 714/753 |
| 4,779,187 A | 10/1988 | Letwin | |
| 4,888,680 A | 12/1989 | Sander et al. | |
| 4,942,606 A | 7/1990 | Kaiser et al. | |

(Continued)

OTHER PUBLICATIONS

NEC Electronics, Inc., "IBM-NEC Meeting for µPD765A/µPD72065 Problem" (U.S.A., May 1987).

(Continued)

*Primary Examiner*—Tariq R. Hafiz
(74) *Attorney, Agent, or Firm*—Pate Pierce & Baird

(57) ABSTRACT

Programmatic detection of time-gap defects in computer system hardware where data is corrupted without detection by the computer system. A detection module initiates data transfers between devices in a computer system. An interrupt service routine interrupts the process by inserting a delay into the data transfer. The detection module then checks for time-gap defects by determining if data was corrupted which went undetected by the computer system. The detection module may repeat the data transfer and insert successively longer delays until a time-gap defect is detected or until a maximum delay value is reached. The results of any time-gap defects found may be output to a user. The length of the delays inserted into a data transfer may be determined dynamically using an iterative search technique to more rapidly converge on time-gap defects. Both bisection and Fibonacci search methods are examples that may be used.

20 Claims, 13 Drawing Sheets

U.S. PATENT DOCUMENTS

| | | | |
|---|---|---|---|
| 4,996,690 A | | 2/1991 | George et al. |
| 5,093,910 A | | 3/1992 | Tulpule et al. |
| 5,212,795 A | | 5/1993 | Hendry |
| 5,233,692 A | | 8/1993 | Gajjar et al. |
| 5,237,567 A | | 8/1993 | Nay et al. |
| 5,379,414 A | | 1/1995 | Adams |
| 5,416,782 A | | 5/1995 | Wells et al. |
| 5,422,892 A | | 6/1995 | Hii et al. |
| 5,471,488 A | * | 11/1995 | Bender ............... 714/55 |
| 5,528,755 A | | 6/1996 | Beardsley et al. |
| 5,619,642 A | | 4/1997 | Nielson et al. |
| 5,870,541 A | * | 2/1999 | Tamura ............... 714/47 |
| 6,088,775 A | * | 7/2000 | Inoue et al. ............... 711/167 |
| 6,115,416 A | | 9/2000 | Katsman et al. |
| 6,223,301 B1 | | 4/2001 | Saneler et al. |
| 6,502,210 B1 | * | 12/2002 | Edwards ............... 714/38 |
| 2002/0101912 A1 | * | 8/2002 | Phelts et al. ............... 375/148 |
| 2003/0021364 A1 | * | 1/2003 | Fan et al. ............... 375/341 |

OTHER PUBLICATIONS

Intel Corporation, Letter to customers from Jim Sleezer, Product Manager, with attachments, regarding FDC error and possible solutions (U.S.A., May 2, 1988).

Adams, P.M., Nova University, Department of Computer Science, "Hardware-Induced Data Virus," Technical Report TR-881101-1 (U.S.A., Nov. 14, 1988).

Advanced Military Computing, "Hardware Virus Threatens Databases," vol. 4, No. 25, pp. 1 & 8 (U.S.A. Dec. 5, 1988).

Intel Corporation, "8237A/8237A-4/8237A-5 High Performance Programmable DMA Controller" (U.S.A., date unknown) pp. 2-52 to2-67.

Intel Corporation, "8272A Single/Double Density Floppy Disk Controller" (U.S.A., date unknown) pp. 6-478 to 6-491.

* cited by examiner

Actual

Good                Bad

┌──────────────┬──────────────┐
         │         62a  │         62b  │
         │              │              │
    Good │   State 1    │   State 2    │
         │              │              │
         │ No Corruption│  Corruption  │
Detected ├──────────────┼──────────────┤
   As    │         62c  │         62d  │
         │              │              │
    Bad  │   State 3    │   State 4    │
         │              │              │
         │ No Corruption│ No Corruption│
         └──────────────┴──────────────┘

FIG. 2

OPTIMIZED-INCREMENTING, TIME-GAP DEFECT DETECTION APPARATUS AND METHOD

RELATED APPLICATIONS

This Patent Application is a continuation-in-part of U.S. patent application Ser. No. 10/715,340, filed Nov. 17, 2003 now U.S. Pat. No. 7,249,203 and entitled PROGRAMMATIC TIME-GAP DEFECT DETECTION APPARATUS AND METHOD, which is a continuation of Ser. No. 09/974,440 filed on Oct. 9, 2001 U.S. Pat. No. 6,691,181, issued Feb. 10, 2004 and entitled PROGRAMMATIC TIME-GAP DEFECT DETECTION APPARATUS AND METHOD.

BACKGROUND

1. The Field of the Invention

This invention relates to computer systems and, more particularly, to novel systems and methods for detecting errors in data exchanged between devices in a computer system, where an undetected data error may persist.

2. The Background Art

Computers are now used to perform functions and maintain data critical to many organizations. Businesses use computers to maintain essential financial and other business data. Computers are also used by government to monitor, regulate, and even activate, national defense systems. Maintaining the integrity of the stored data is essential to the proper functioning of these computer systems, and data corruption can have serious (even life-threatening) consequences.

Computers store information in the form of numerical values, or data. Information represented as data may take many forms including a letter or character in an electronic document, a bank account number, an instruction executable by a processor, operational values used by software, or the like. Data may be stored permanently in long-term memory devices or may be stored temporarily, such as in a random access memory. Data may flow between devices, over networks, through the Internet, be transmitted wirelessly, and the like.

Data may be changed or overwritten in many cases, such as when an account balance or date is automatically updated. However, computer users expect a computer system not to make inadvertent or incorrect changes to data, compromising its integrity. When these inadvertent or erroneous changes do occur, data corruption is incurred. The causes of data corruption may be numerous, including electronic noise, defects in physical hardware, hardware design errors, and software design errors.

Hardware design flaws may result from oversights or inaccuracies in specifying timing, function, or requirements for interfacing with other hardware in a circuit or computer system. Computer system hardware designers may build a certain amount of design margin into a system to allow for voltages to settle, signal rise and fall times, and the like. Specifications usually provide margins and limits. If insufficient design margin is provided or timing errors cause signals to be read at incorrect times, data corruption may result. Thus, even when data may be stored correctly in memory devices or calculations are performed correctly by a processor, data may be corrupted when transferred between hardware devices due to timing inconsistencies or insufficient design margin.

Different approaches may be used to reduce or eliminate data corruption. One approach may be to prevent data corruption from happening in the first place. This may be accomplished, in part, by improving the quality and design of hardware and software systems. Data is transmitted and manipulated by myriad different hardware components in a computer system including buses, controllers, processors, memory devices, input and output devices, cables and wires, and the like. Software may contain glitches or logical flaws. Each one of these hardware components or software applications is a possible candidate for incurring data corruption.

Another approach is to build error detecting and correcting capabilities into the hardware and software systems. Error correction such as parity checking, redundant systems, and validity checking can help to detect and correct data corruption.

In certain hardware systems, time-gaps may exist in which erroneous data transfers between devices may occur, yet remain undetected by the hardware involved. Specifications for controllers or other devices in a computer system may have very rigorous time requirements stating when error processing may actually detect and report an error or not. There may not be an absolute time, but there may be an absolute time plus or minus a tolerance, where the tolerance value may be very small. This value may determine time-gaps where errors may go undetected by a device. Detecting these time-gaps in hardware systems may be critical in order to identify possible sources of data corruption due to faulty hardware design.

For example, clock speeds used by computer systems are increasing rapidly. Additionally, new conflicts and timing discrepancies may arise between devices in a computer system. Errors may be introduced into data transfers due to inconsistences in timing requirements between hardware devices. Many of these hardware devices may be time sensitive and rely on different tolerances or levels of resolution in precision with respect to receiving or transmitting data. In some cases, rounding errors may cause devices to conclude that a data transfer has been performed correctly, when in fact errors were incurred into the operation.

Time-gap defects may occur in other scenarios as well and may be due to the timing inconsistencies as previously described. In some cases, designers may have unknowingly left timing inconsistences unaccounted for in their design of hardware or software systems. Good engineering may require that a certain amount of timing overlap be designed into systems in order to safeguard against timing inconsistencies that may exist. However, due to oversight, improper information, neglect, or the like, time-gap defects may be designed into systems.

Other conditions under which data corruption may occur may be identified by simply identifying those conditions that can delay data transfer between devices. Often, this condition may result from computer systems engaging in "multi-tasking" operation or in overlapped input/output ("I/O") operation. Multi-tasking is the ability of a computer operating system to simulate the concurrent execution of multiple tasks. Importantly, concurrent execution is only "simulated" because there is usually only one CPU in today's personal computers, and it can only process one task at a time. Therefore, a system interrupt is used to rapidly switch between multiple tasks, giving the overall appearance of concurrent execution. In some case, the interrupts caused by switching from task to task may occur while a device is in the middle of a data transfer, such as a read or write operation, and be sufficient to incur an error into the data transfer.

BRIEF SUMMARY AND OBJECTS OF THE INVENTION

In view of the foregoing, it is a primary object of the present invention to provide a detection module capable of detecting time-gap defects in computer systems.

Consistent with the foregoing objects, and in accordance with the invention as embodied and broadly described herein, an apparatus and method are disclosed, in suitable detail to enable one of ordinary skill in the art to make and use the invention. In certain embodiments an apparatus and method in accordance with the present invention may include a detection module stored in the memory of a computer system. The detection module may be configured to detect time-gap defects between controllers, between memory and input or output devices, or between any number of different hardware resources in a computer system. The detection module may include an input module, an initialization module, an operation module, a verification module, and an output module for performing its various functions.

An apparatus and method in accordance with the invention may be configured to march across a suspect domain by inserting delays into a data transfer operation. This "marching" process may occur by successively increasing the delays by a user-defined delay step value until an error is incurred into the data transfer. Once an error is incurred, the delay value may be reduced and the delay step value decremented.

The process may be repeated again by marching across the suspect domain in increments of the decremented delay step value, inserting the delays into the data transfer operation until an error is incurred. Once an error is incurred, the delay value may again be reduced and the delay step value decremented. The process of marching across the suspect domain and decrementing the delay step value may continue until a minimum delay step is reached. An apparatus in accordance with the invention may use this process to search for the minimum delay step needed to incur an error into the data transfer which remains undetected by the computer system.

For example, an apparatus and method in accordance with the invention may initiate a data transfer between devices in a computer system. The data transfer, such as may be performed during a read or write operation, may be interrupted by a delay value having a user-defined duration. After the data transfer has finished, a test may be performed to determine whether the delay incurred an error into the data transfer or not. Once this determination is made, a test may then determine whether an error was detected by the devices involved in the data transfer.

If neither an error is incurred into the data transfer nor an error is detected by any of the devices, the data transfer may be repeated and a second delay time, having a longer duration than the first delay, may be inserted into the data transfer to interrupt the transfer. After the transfer has terminated, the same tests may be repeated. The length of the delay may be determined based on an iterative search procedure. Thus, for example, any programmatic method of incrementing the delay "on the fly," such as the bisection method or Fibonacci search, may be used to calculate the length of the delay used in each test.

In this manner, the process may be repeated until an error is incurred which remains undetected by the computer system. Thus, time-gap defects may be detected in a system. If there are not any time-gap defects detected, the process may be terminated once a maximum delay value is reached.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

FIG. 2 is a chart illustrating various states wherein a selected data transfer may be reported correctly or incorrectly by a computer system;

DETAILED DESCRIPTION OF THE PREFERRED EMBODIMENTS

It will be readily understood that the components of the present invention, as generally described and illustrated in the Figures herein, could be arranged and designed in a wide variety of different configurations. Thus, the following more detailed description of the embodiments of the system and method of-the present invention, as represented in FIGS. 1 through 7, is not intended to limit the scope of the invention, as claimed, but it is merely representative of the presently preferred embodiments of the invention.

The presently preferred embodiments of the invention will be best understood by reference to the drawings, wherein like parts are designated by like numerals throughout.

Figure 1:
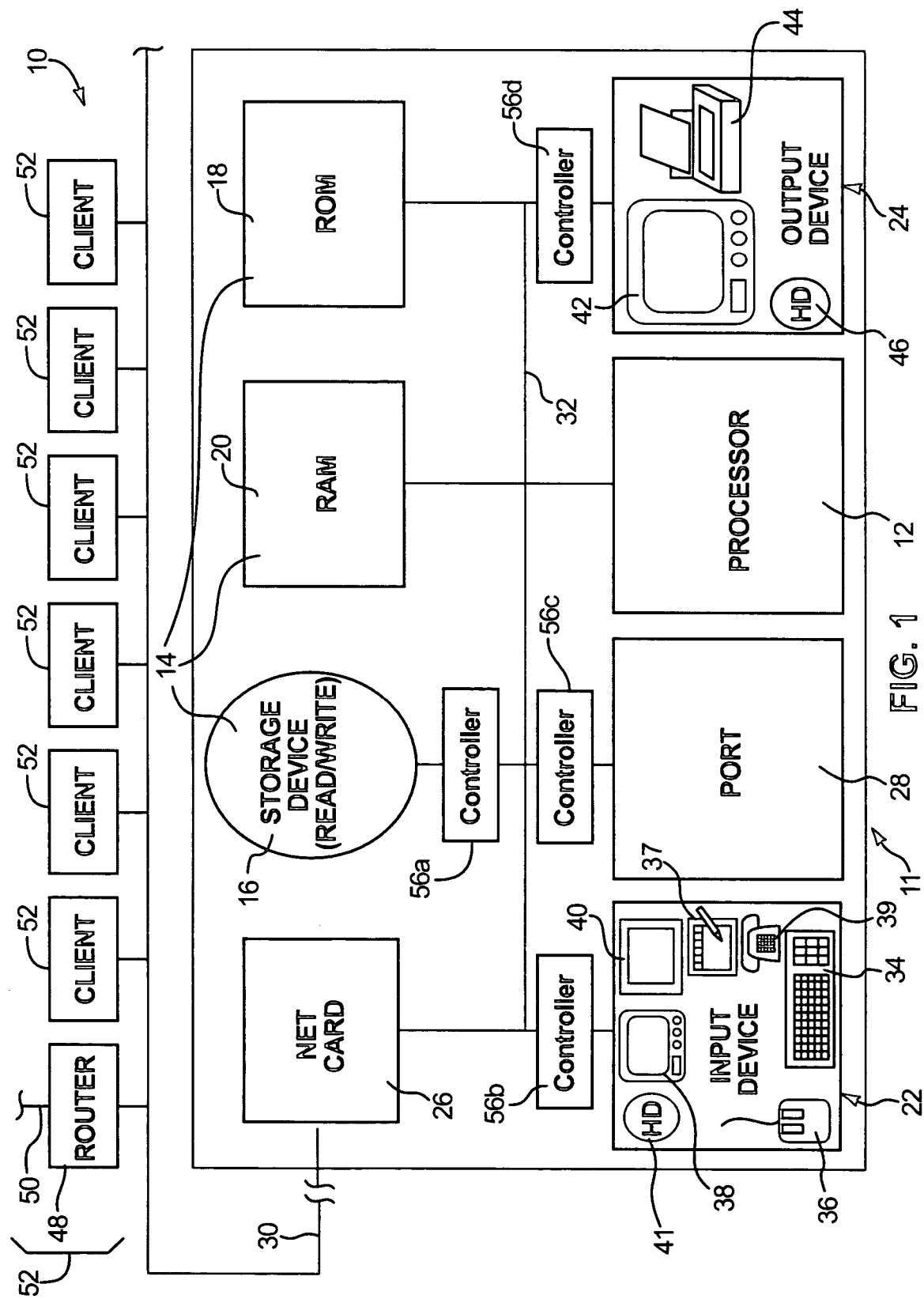
FIG. 1 is a schematic block diagram of a system consistent with a computer hosting executables and data to implement the invention.

Referring to FIG. 1, an apparatus 10 may implement the invention on one or more nodes 11, (client 11, computer 11) containing a processor 12 (CPU 12). All components may exist in a single node 11 or may exist in multiple nodes 11, 52 remote from one another. The CPU 12 may be operably connected to a memory device 14. A memory device 14 may include one or more devices such as a hard drive or other non-volatile storage device 16, a read-only memory 18

(ROM) and a random access (and usually volatile) memory 20 (RAM/operational memory).

The apparatus 10 may include an input device 22 for receiving inputs from a user or another device. Similarly, an output device 24 may be provided within the node 11, or accessible within the apparatus 10. A network card 26 (interface card) or port 28 may be provided for connecting to outside devices, such as the network 30. Controllers 56a-d may be included in the apparatus 10 to control transfers of data between any of the input devices 22, output devices 24, network card 26 port 28, the processor 12, and the memory devices 14.

Internally, a bus 32 may operably interconnect the processor 12, memory devices 14, input devices 22, output devices 24, network card 26 and port 28. The bus 32 may be thought of as a data carrier. As such, the bus 32 may be embodied in numerous configurations. Wire, fiber optic line, wireless electromagnetic communications by visible light, infrared, and radio frequencies may likewise be implemented as appropriate for the bus 32 and the network 30.

Input devices 22 may include one or more physical embodiments. For example, a keyboard 34 may be used for interaction with the user, as may a mouse 36 or stylus pad. A touch screen 38, a telephone 39, or simply a telephone line 39, may be used for communication with other devices, with a user, or the like. Similarly, a scanner 40 may be used to receive graphical inputs which may or may not be translated to other character formats. The hard drive 41 or other memory device 41 may be used as an input device whether resident within the node 11 or some other node 52 (e.g., 52a, 52b, etc.) on the network 30, or from another network 50.

Output devices 24 may likewise include one or more physical hardware units. For example, in general, the port 28 may be used to accept inputs and send outputs from the node 11. Nevertheless, a monitor 42 may provide outputs to a user for feedback during a process, or for assisting two-way communication between the processor 12 and a user. A printer 44 or a hard drive 46 may be used for outputting information as output devices 24.

In general, a network 30 to which a node 11 connects may, in turn, be connected through a router 48 to another network 50. In general, two nodes 11, 52 may be on a network 30, adjoining networks 30, 50, or may be separated by multiple routers 48 and multiple networks 50 as individual nodes 11, 52 on an internetwork. The individual nodes 52 (e.g. 11, 52, 54) may have various communication capabilities.

In certain embodiments, a minimum of logical capability may be available in any node 52. Note that any of the individual nodes 11, 52, 54 may be referred to, as may all together, as a node 11 or a node 52. Each may contain a processor 12 with more or less of the other components 14-44.

A network 30 may include one or more servers 54. Servers may be used to manage, store, communicate, transfer, access, update, and the like, any practical number of files, databases, or the like for other nodes 52 on a network 30. Typically, a server 54 may be accessed by all nodes 11, 52 on a network 30. Nevertheless, other special functions, including communications, applications, directory services, and the like, may be implemented by an individual server 54 or multiple servers 54.

In general, a node 11 may need to communicate over a network 30 with a server 54, a router 48, or nodes 52. Similarly, a node 11 may need to communicate over another network (50) in an internetwork connection with some remote node 52. Likewise, individual components 12-46 may need to communicate data with one another. A communication link may exist, in general, between any pair of devices.

When devices 12, 14, 22, 24, 26, 28 transfer data between one another within the node 11, controllers 56a-d may be included to control the transfer of data through the bus 32. Likewise, if an error is introduced into a transfer of data therebetween, the controllers 56a-d may include error detection capabilities to notify the system 11 that an error has occurred. The transfer may be subsequently repeated until performed correctly or the error may be corrected by the controller 56 itself. Therefore, error detection and correction capabilities are critical to avoid data corruption. Data integrity of stored or transferred data may be essential to the proper functioning a computer system 11 or computer systems 52, and data corruption can have serious (even life threatening) consequences.

An error may be "detected" by merely detecting a condition known to cause the error. For example, conditions under which errors may occur may be identified by simply identifying those conditions that can delay data transfer between devices 12, 14, 22, 24, 26, 28. In general, this condition may result from computer systems engaging in "multi-tasking" operation or in overlapped input/output ("I/O") operation. Multi-tasking is the ability of a computer operating system to simulate the concurrent execution of multiple tasks. Importantly, concurrent execution is only "simulated" because there is usually only one CPU in today's personal computers, and it can only process one task at a time. Therefore, a system interrupt is used to rapidly switch between the multiple tasks, giving the overall appearance of concurrent execution. Thus, the interrupts that occur from multitasking present one way that a data transfer may be delayed, thereby increasing the chances that an error will actually be incurred.

In certain hardware configurations, time-gaps may exist in which erroneous data transfers between devices 12, 14, 22, 24, 26, 28 may occur, yet remain undetected to the computer system 11. These "time-gap" errors may be caused by discrepancies in selections of timing increments relied upon by the controllers 56 and devices 12, 14, 22, 24, 26, 28 involved transfers of data.

Specifications for controllers 56 or other devices in a computer system may have very rigorous time requirements stating when error processing may actually detect an error or not. There may not be an absolute time, but there may be an absolute time plus or minus a tolerance, where the tolerance value may be very small. This tolerance may determine the "time-gap" of a device and where the hardware and corresponding transmission of data may be susceptible to corruption without detection. Thus, it may be critical to detect these types of "time-gaps" since they may undermine the integrity of data in a computer system 11.

For example, clock speeds and switching times used by computer systems 11 are increasing rapidly. Due to changing clock speeds, hardware or software design errors, or the like, conflicts and timing discrepancies may arise between devices in a computer system. Inconsistences in timing requirements between hardware devices may introduce errors into data transfers conducted therebetween. Hardware devices may be time sensitive and rely on different tolerances or levels of resolution in precision with respect to receiving or transmitting data. In some cases, rounding errors may cause devices to conclude that a data transfer has been performed correctly, when in fact errors were incurred into the operation.

For example, in a simplified scenario, a device may have a resolution such that it can only detect the length of a data transfer in timing increments of 0.8 s, 0.9 s, 1.0 s, 1.1 s, 1.2 s, etc., and an error is incurred for any data transfer taking more than 1.0 s. If a faster clock speed allows a data transfer of 1.03 s to occur, an error will be incurred. However, since the device may only recognize values of 0.8 s, 0.9 s, 1.0 s, 1.1 s, 1.2 s, etc., rounding the 1.03 s to 1.0 s may result that the device actually detects that the data transfer occurred successfully. If all values between 1.01 s and 1.04 s are rounded to 1.0 s, then data transfers of length 1.01 s-1.04 will incur errors yet remain undetected to the device. In effect, there is a "time-gap" defect for data transfers having lengths between 1.01 s-1.04 s in which errors incurred will go undetected by the hardware involved.

In certain circumstances, designers may have unknowingly left timing inconsistences unaccounted for in their design of hardware or software systems 11. Good engineering practice may involve designing a certain amount of timing overlap into systems in order to prevent time-gap defects from being designed into systems 11. However, due to oversight, improper information, neglect, or the like, time-gap defects may exist in certain systems 11.

Referring to FIG. 2, detection of time-gap defects may be further illustrated by a chart 60 divided into states 62a-d. Across the top of the chart 60, two columns are labeled as "good" and "bad" to define the actual result of a data transfer between devices 12, 14, 22, 24, 26, 28 in a computer system 11. Along the left side of the chart 60, two rows are labeled as "good" and "bad" to define whether the data transfer was detected by the devices 12, 14, 22, 24, 26, 28 as good or bad.

States 62a, 62d are not of concern since, in the state 62a, a transfer was performed without errors and was detected correctly by the hardware as good. Likewise, in the state 62d, a transfer was performed unsuccessfully (with errors) and was detected correctly by the hardware as bad. In this case 62d, error correction capabilities in a device 12, 14, 22, 24, 26, 28 may initiate the necessary actions to correct the errors.

In the case of state 62c, a data transfer performed successfully (without errors) is detected as bad by a device 12, 14, 22, 24, 26, 28. Although in this case 62c, a data transfer is incorrectly detected as bad, this case will probably not result in data corruption because error correction capabilities of a device may repeat the data transfer again until a device 12, 14, 22, 24, 26, 28 detects that it is performed successfully.

The state 62b is of primary concern because this state may result in undetectable data corruption. An erroneous data transfer is not detected, or worse, is actually detected as a "good" data transfer. In this case 62b, data is corrupted and remains uncorrected since it is undetected. It is this case 62b or scenario 62b that the present invention addresses, although an apparatus in accordance with the present invention may also be able to identify the other states 62a, 62c, 62d or cases 62a, 62c, 62d.

For example, an apparatus and method in accordance with the invention may be configured to march across a suspect domain from the state 62a to the state 62d by inserting delays into a data transfer operation. This "marching" process may occur by successively increasing the delays by a user-defined delay step value until an error is incurred (state 62d) into the data transfer. Once an error is incurred (state 62d), the delay value may be reduced and the delay step value decremented (essentially moving back into the state 62a).

The process may be repeated again by marching across the suspect domain in increments of the decremented delay step value, inserting the delays into the data transfer operation until an error is incurred. Once an error is incurred (state 62d), the delay value may again be reduced and the delay step value decremented (moving back again into the state 62a). The process of marching across the suspect domain and decrementing the delay step value may continue until a minimum delay step is reached. An apparatus in accordance with the invention may use this process to search for the minimum delay step needed to incur an error into the data transfer which remains undetected by the computer system (state 62b). Thus time-gap defects (state 62b) may be detected in a computer system 11.

Figure 3:
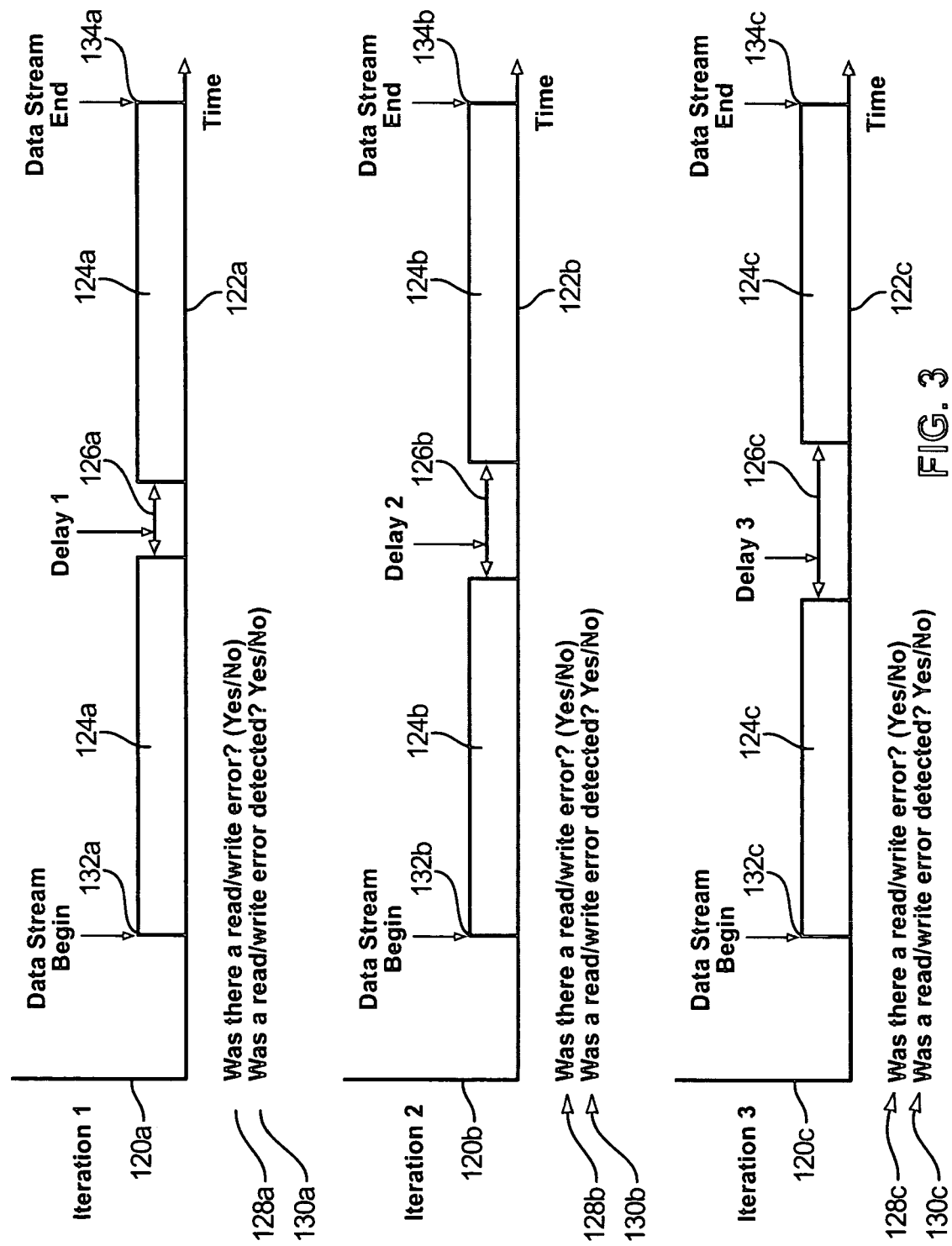
FIG. 3 is a group of several graphs illustrating delays being inserted into data transfers in accordance with the invention.

Referring to FIG. 3, a methodology may be used to determine if time-gap defects exist between controllers, between memory and input or output devices, or between any number of different hardware resources in a computer 11. For example, a first data transfer 120a may be initiated 132a between two devices in a computer system. A data stream 124a, such as may be transferred during a read or write operation, may be interrupted by a first delay value 126a having a first duration 126a. After the data transfer 124a has finished 134a, a first test 128a may determine whether a read or write error occurred, or not. A second test 130a may then determine whether a read or write error was detected, or not.

If no discrepancy between the two tests 128a, 130a exists, a second iteration 120b may be performed. By discrepancy is meant the case where a read or write error in fact occurred, but was not detected. A second iteration 120b may initiate 132b a second data transfer 124b. A second delay value 126b having a second longer duration 126 may then be inserted into the data transfer 124b. After the transfer 124b has finished, the tests 128b, 130b may then be repeated. The test 128b may check if a read or write error in fact occurred from the delay 126 and the test 130b may check if the read or write error was detected.

If no discrepancy between the tests 128b, 130b is found, a third iteration 120c may be initiated 132c. A third delay time 126c, having a longer duration 126 than the previous delay 126b, may be inserted into the data stream 124 to interrupt the transfer 124c. After the transfer 124c has terminated, the tests 128c, 130c may once again be repeated in order to detect a discrepancy.

In this manner, the process may be repeated until a read or write error occurs which goes undetected by the computer system 11. Thus, time-gap defects, as previously described, may be detected in a computer system 11. If, no time-gap defects are detected, the process may be terminated once a maximum delay value 126 is reached.

Figure 4:
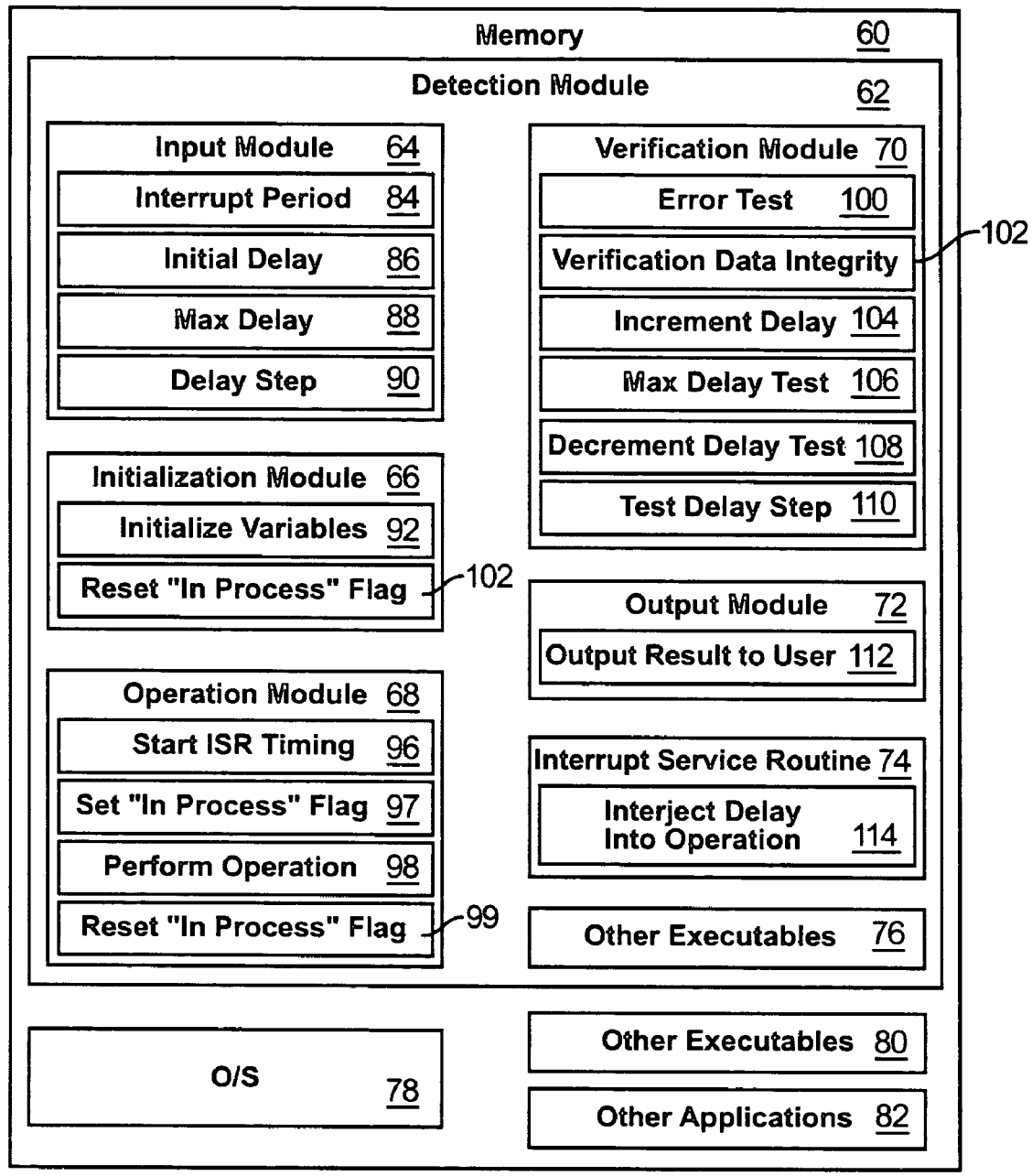
FIG. 4 is a schematic block diagram of data structures containing executables and operational data for implementing an embodiment of the invention on the apparatus of FIG. 1.

Referring to FIG. 4, an apparatus in accordance with the present invention may include a detection module 62 stored (for execution in a processor) in a memory 60, such as any of the memory devices 14. The detection module 62 may include an input module 64 configured to receive input from a user or other machine. A user may define operating parameters used in the operation of detection module 62.

For example, a user may define an interrupt period 84 setting the frequency with which a data transfer will be interrupted. An initial delay value 86 may also be chosen by the user to define an initial delay time or duration which will be inserted into a data transfer. Likewise, a maximum delay value 88 may be selected by the user to define the maximum delay time or duration to be used before exiting the detection module 62. Finally, a delay step 90 or increment 90 may be chosen by a user to define a step increment that the initial delay value 86 will be increased or decreased by until the maximum or minimum delay value 88 is reached.

The detection module 62 may include an initialization module 66 configured to initialize internal variables 92 of the detection module 62 with the operating parameters 84, 86, 88, 90 received from the input module 64. In addition, an "in process" flag 94, indicating when an data transfer is actually occurring, may be reset in the initialization module 62.

The detection module 62 may also include an operation module 68 to initiate a data transfer. The operation module 68 may also start an interrupt service routine 74 which may interrupt the data transfer at a frequency corresponding to the interrupt period 84 defined in the input module 64. The timing of the interrupt service routine 74 may be controlled by the CPU 12, a separate timer, or the like.

The operation module 68 may contain a command to set the "in process" flag 97 to indicate that the data transfer is in process, perform the data transfer 98, and then reset the "in process" flag to indicate that the data transfer is completed. The exact timing when the interrupt service routine 74 inserts a delay into the data transfer 98 may be unimportant. Thus, the interrupt service routine 74 may essentially insert a delay randomly within the performed data transfer 98.

The detection module may include a verification module 70 to verify the results of the interrupted data transfer. An error test 100 may be executed in the verification module 70 to determine if the hardware, involved in the data transfer, detected an error. A separate test 102 may actually verify the integrity of the data transferred. For example, if the data transfer was a write operation, the integrity of the data may be verified by actually reading back the data.

During a process in accordance with the invention, the data integrity may or may not be checked. Typically, an event known to cause data errors is more easily checked. If a delay, having a value, has not been sufficient to introduce an error into a data transfer performed by the operation module 68, the verification module 62 may increment 104 the duration of the delay inserted by the interrupt service routine 74 and then re-execute the operation module 68. This procedure 104 may be repeated until an undetected error is incurred or until an error is detected by the system responsible for error-checking the hardware involved.

If neither an undetected error is incurred nor an error is detected by the hardware system, a test 106 may be used by the verification module 70 to exit the program once a maximum delay value 88 is reached. In the case wherein the hardware detects an error, a delay step decrementing procedure 108 may be implemented to decrement the delay step duration in order to zero in on any possible time-gap defects which may incur an undetected error. This may allow the detection module 62 to provide a more precise timing of when or in what time range an undetected error actually occurs. This procedure will be described in more detail in the flow chart of FIG. 6.

Finally, the delay step decrementing procedure 108 may continue decrementing the delay step until a minimum possible delay step value (increment) is reached. The precision of a delay time inserted into an data transfer is necessarily limited by the system involved. In other words, a computer system is only capable of providing a delay duration having a certain resolution. Therein lies a problem. Different hardware and software systems rely on different precision ore resolution. A test 110 may be included in the verification module 70 to indicate when the delay step value has reached this minimum delay step value.

The detection module 62 may also include an output module 72 to provide the results of the detection module to a user. For example, the output module may provide a message notifying a user if an undetected error is found (false negative), and likewise, provide a message notifying a user when no undetected error is found (negative) or a non-existent error is detected (false positive).

The detection module 62 in accordance with the present invention may also contain other executables 76 as needed to detect time-gap defects and provide feedback to a user. In addition, an operating system 78 may be contained within the memory 60 to facilitate execution of the detection module 62 on a computer system 11. The memory 62 may likewise contain other executables 80 and other applications 82 which may be run on the computer system 11.

Figure 5:
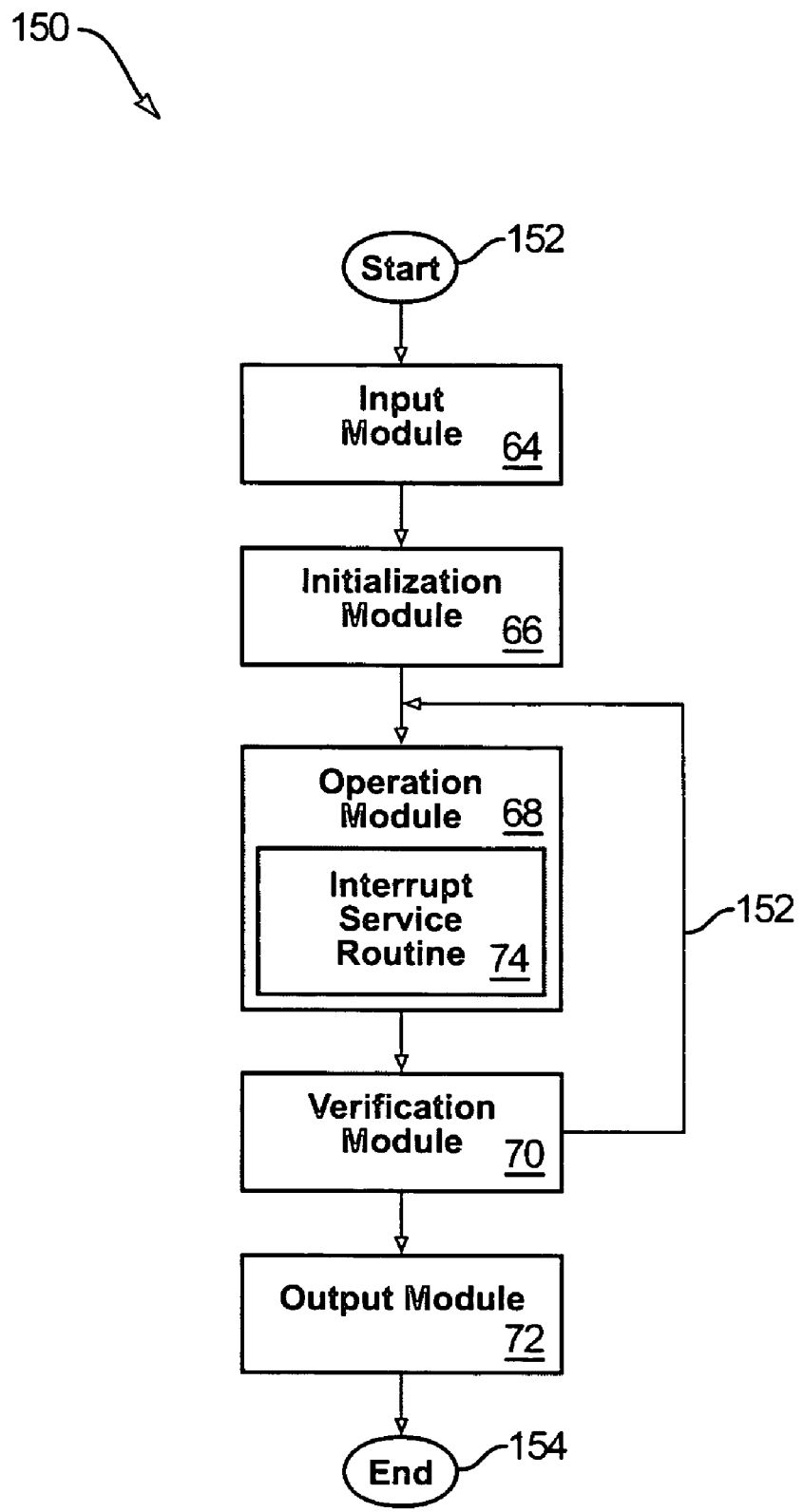
FIG. 5 is a high level flow illustrating execution of the detection module of the present invention.

Referring to FIG. 5, a flow chart 150 illustrates one embodiment of a process 150 followed by the detection module 62. The process 150 may start by running 152 or opening the detection module 62 on a computer system 11 with an operating system 78. The input module 64 may then be executed in order to request operating parameters of the detection module 62 from a user. The internal variables may then be initialized by the initialization module 66. The operation module 68 may then perform a data transfer involving hardware in a computer system 11. The operation module 68 may be interrupted by an interrupt service routine 74 configured to insert a delay into the data transfer performed by the operation module 68.

Once the data transfer is complete, a verification module 70 may verify that the data transfer completed successfully, or that errors were introduced into the data transfer. If errors were in fact incurred, the verification module 70 identifies whether or not errors went undetected by the hardware involved. If the errors occurred and were undetected (false positive), the output module 72 may announce that an undetected error has been found. If no undetected errors were found, the verification module may loop 156 back to the operation module 68 after modifying various operating parameters. After the verification module 70 has modified the operating parameters and has looped back to the operation module 68 sufficiently to determine that no time-gap defects remain, the output module 72 may announce that no undetected errors have been found and the process 150 may end 154.

Figure 6:
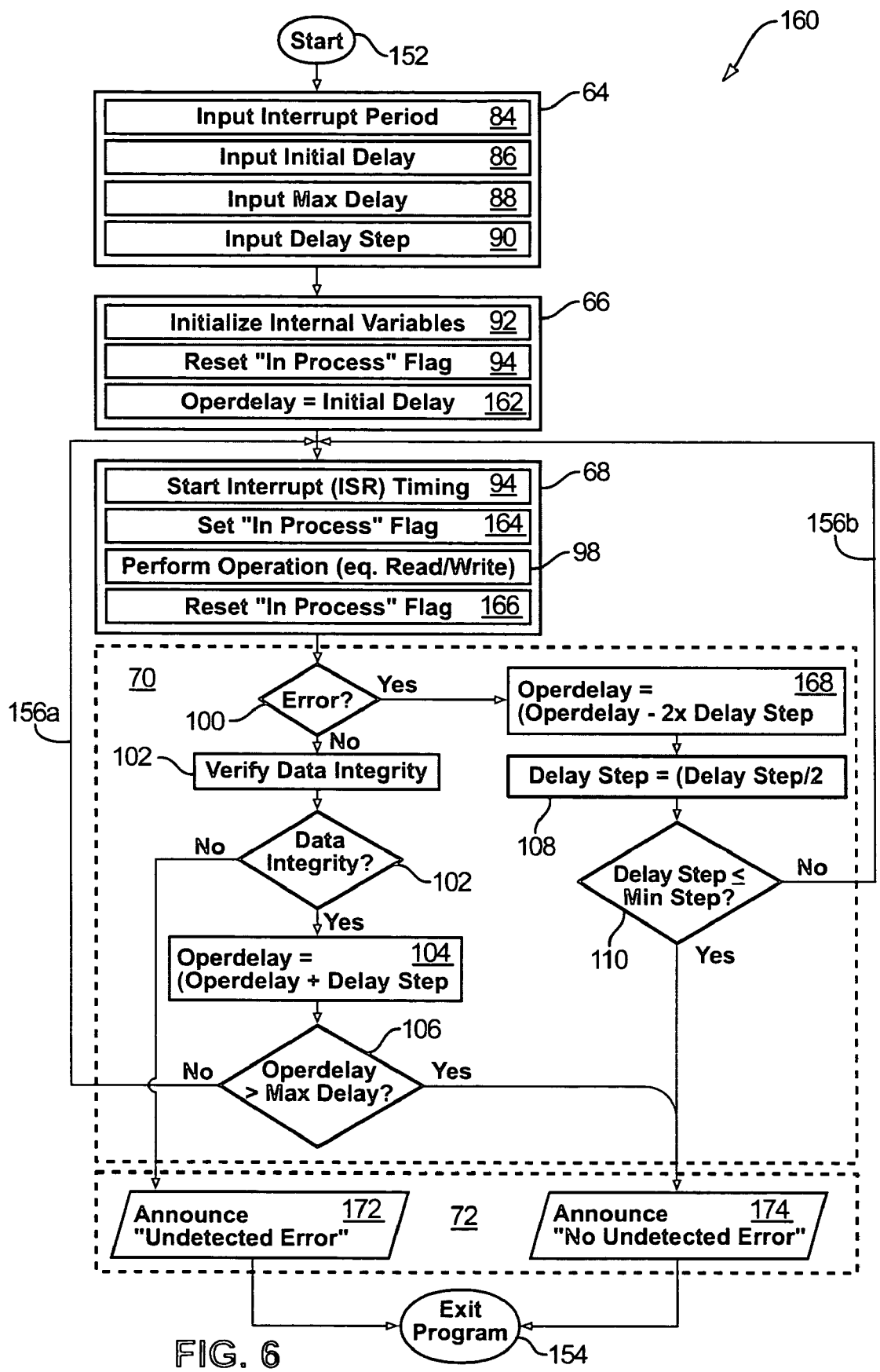
FIG. 6 is a flow chart illustrating more detail of the algorithm used by the detection module of the present invention.

Referring to FIG. 6, one embodiment of an algorithm for the detection module 62 may begin at a starting point 152 and continue to the input module 64. The input module 64 may be configured to request settings or operating parameters from a user. For example, operating parameters received from a user may include an interrupt period 84, an initial delay value 86, a maximum delay value 88, and a delay step value 90. The significance of these operating parameters will be more easily understood by the description hereafter.

The input module 64 may then continue to the initialization module 66. The initialization module 66 may initialize the internal variables 92 of the detection module 62 with operating parameters as herebefore described. The internal variables 92 may be used as operational data by the detection module 62. The initialization module 66 may also reset the "in process" flag 94. The "in process" flag may be set 164 when a data transfer is in process and reset 166 when not in process. In addition an operational delay (operdelay) 162 may be initialized with a value corresponding to the initial delay value 86.

Once the initialization process 66 takes place, the operational module 68 may be executed. The operational module may start the timing 96 of the interrupt service routine 74. The interrupt service routing 74 may be called periodically as defined by the interrupt period 84 requested at the input module 64 and may be configured to insert the operational delay 162 into the data transfer 98 being performed. The functioning of the interrupt service routine 74 will be described in more detail in the description of FIG. 7.

The "in process" flag may be set 164, the data transfer performed 98, such as a read or write operation, and the interrupt service routine 74 may insert the operational delay 162 therein. Once the data transfer 98 is complete, the "in process" flag may be reset 68 indicating that the data transfer 98 is no longer in process.

The process 160 may then continue on to the verification module 70, responsible to verify the integrity of the data transfer 98 and adjust the operating parameters, to a decision point 100, or test 100. If an error was not detected by the hardware involved in the data transfer, the next step is to verify the data integrity 102. For example, if the data transfer was a simple write operation, the data may be verified by simply reading back the written data and verifying that it is correct. With other data transfers, the verifying procedure 102 may be much more complex in order to verify data integrity.

The process now moves on to the next decision point 170, or test 170. If an error was found and there is not data integrity, then this would indicate that an error was introduced into the data transfer by the operational delay 162 but remained undetected to the hardware involved. This indicates that time-gap defects that may cause data corruption have been found. Accordingly, the output module 72 may output a message 172 notifying a user that an undetected error has been found.

If at decision point 170 there is data integrity, then step 104 may be executed by incrementing the operational delay 162 by the delay step value 90. A test 106 may then verify that the operational delay 162 is not greater than the maximum delay value 88. If the operational delay 162 is not greater than the maximum delay value 88, the process follows the loop 156a back to the operation module 68 where a data transfer 98 may be performed again, only this time the data transfer 98 is interrupted by the operational delay 162 increased by the delay step value 90. Thus, the step size and the total delay can test whether the actual occurrence of an error, and the reporting system for detecting it, have both used the same degree of precision or have otherwise assured consistency therebetween. If at the decision point 106, the operational delay 162 has exceeded the maximum delay value 88, then this may indicate that no undetected error has been found and the output module 72 may output a message 174 notifying a user of this result.

Returning to the decision point 100, if the hardware involved in the data transfer does detect an error, then step 168 may reduce the operational delay 162, by some amount, such as by twice the value of the delay step value 90. A step 108 may follow, which may reduce the value of the delay step value 90, such as by dividing it in half. A test 110 or decision point 110 may compare the new reduced delay step with the minimum step value. If the delay step is not less than or equal to the minimum step value, then the process follows the loop back up to the operation module 68 where the data transfer may be performed again with the modified operational delay value (modified in step 168).

Thus, when an error is detected by the hardware at the decision point 100, step 168 essentially attempts to reduce the operational delay 162 to a point where there is no error detected by the hardware. Step 108 reduces the delay step value, and the process cycles back up to operation module 68 by way of loop 156b.

By this process, the detection module 62 may essentially zero in on any time-gap defects that may exist. This continues to occur until the delay step value 90 is less than or equal to the minimum step value (test 110), in which case the output module 72 may output a message 174 notifying the user that no undetected error was found. Once the output module 72 has notified the user that an undetected was found or was not found, the program terminates 154 or exits 154.

Figure 7:
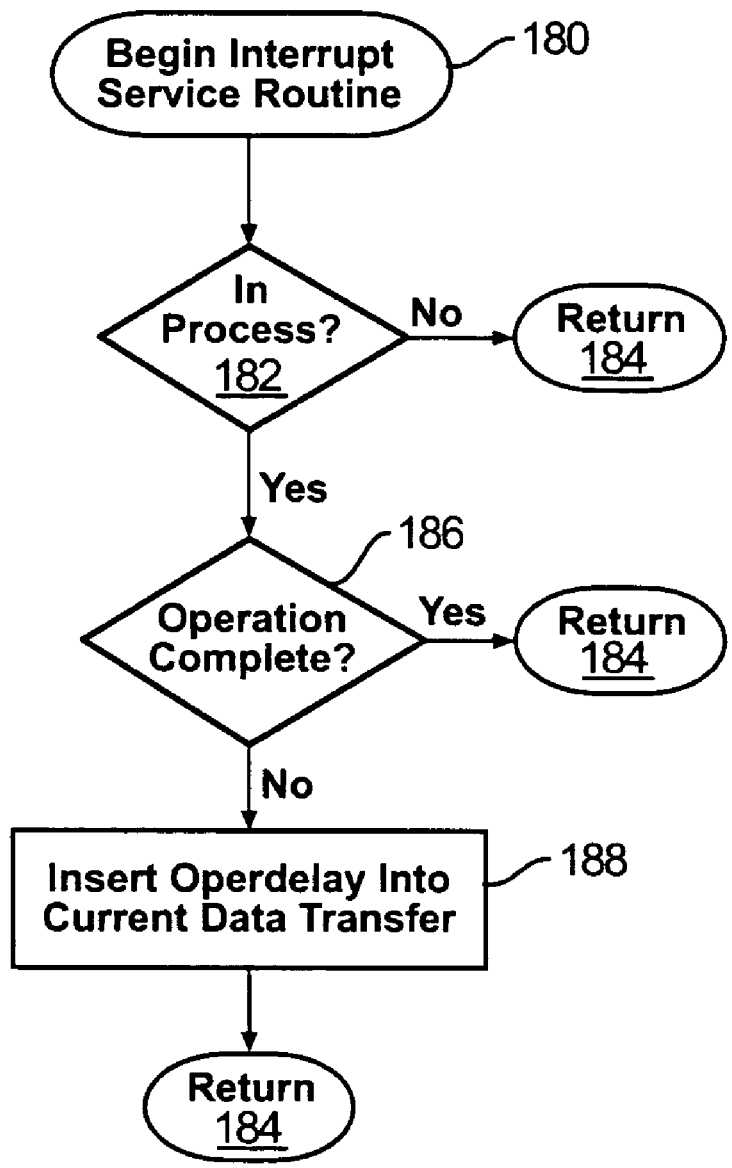
FIG. 7 is a flow chart of the interrupt service routine used within the detection module of the present invention.

Referring to FIG. 7, an interrupt service routine 74 may be executed periodically according to the interrupt period 84 defined in the input module 64. A decision point 182 may test whether the data transfer is in process or not. If the data transfer is not in process, then the interrupt service routine 74 may return operation to the detection module 62. If the data transfer is in process, then the interrupt service routine 74 continues on to the next decision point 186. If the data transfer is complete, then the interrupt service routine 74 returns operation to the detection module 62. If the data transfer is not complete, then the current value of the operational delay 162 is inserted 188 into the current data transfer. The interrupt service routine 180 then returns control back to the detection module 62.

Figure 8:
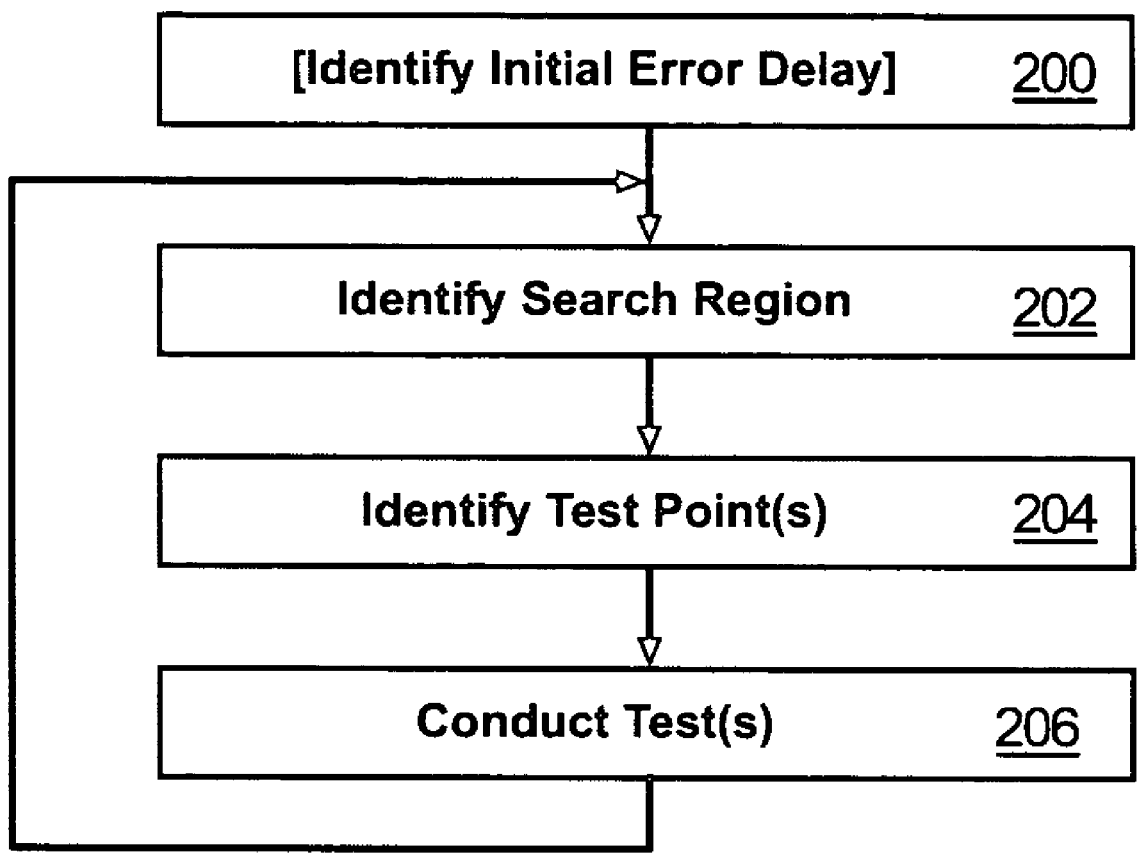
FIG. 8 is a process flow diagram of a method for searching for undetected error conditions.

Referring to FIG. 8, various other methods and systems may be used to introduce delays into communication between devices 12, 14, 22, 24, 26, 28. Specifically, a method 198 of locating a threshold delay above which undetected errors may occur may include using an adaptive or programmed increment type of search technique such as the bisection method, Fibonacci search method, or other like method for locating critical points.

A search method may include identifying 200 an initial error delay. Identifying 200 an initial error delay may be defined as identifying the delay that will cause the device 12, 14, 22, 24, 26, 28 being evaluated to generate an error or error message. Identifying 120 an initial error delay may be accomplished by any method discussed hereinabove. It will be noted that identifying 200 an initial error delay may be omitted in some embodiments. For example, a user input value or hard coded value may be used instead.

A method 198 may include identifying 202 a search region. Identifying 202 may include identifying a beginning delay and an ending delay between which undetected errors are certain to occur, if undetected errors occur at all. The beginning delay and ending delay may be hard-wired, user defined, or defined by the device 12, 14, 22, 24, 26, 28 being evaluated. An ending delay may be set equal to the delay at which an error occurred in a step 202. A beginning delay may be set equal to a small value (relative) or zero.

A method 198 may also include identifying 204 a test delay, or test delays. Test delays may be identified based on some criterion, specified by a user, or may be hard coded. In embodiments of the method 198 using a bisection search method, a test delay may be identified 204 as the average of the beginning and ending delays. For embodiments of the method 198 using the Fibonacci method, two test delays may be identified as defined by that method.

A method 198 may include conducting 206 an initial test, or tests. Conducting 206 an initial test or tests may include introducing a delay equal to the test delay identified in step 204 into a write or read operation and evaluating whether a device 12, 14, 22, 24, 26, 28 reports an error or fails to detect an error. For embodiments of the method 198 identifying multiple test points, a test may be conducted for each delay identified in the test delay identifying step 204.

Figure 9:
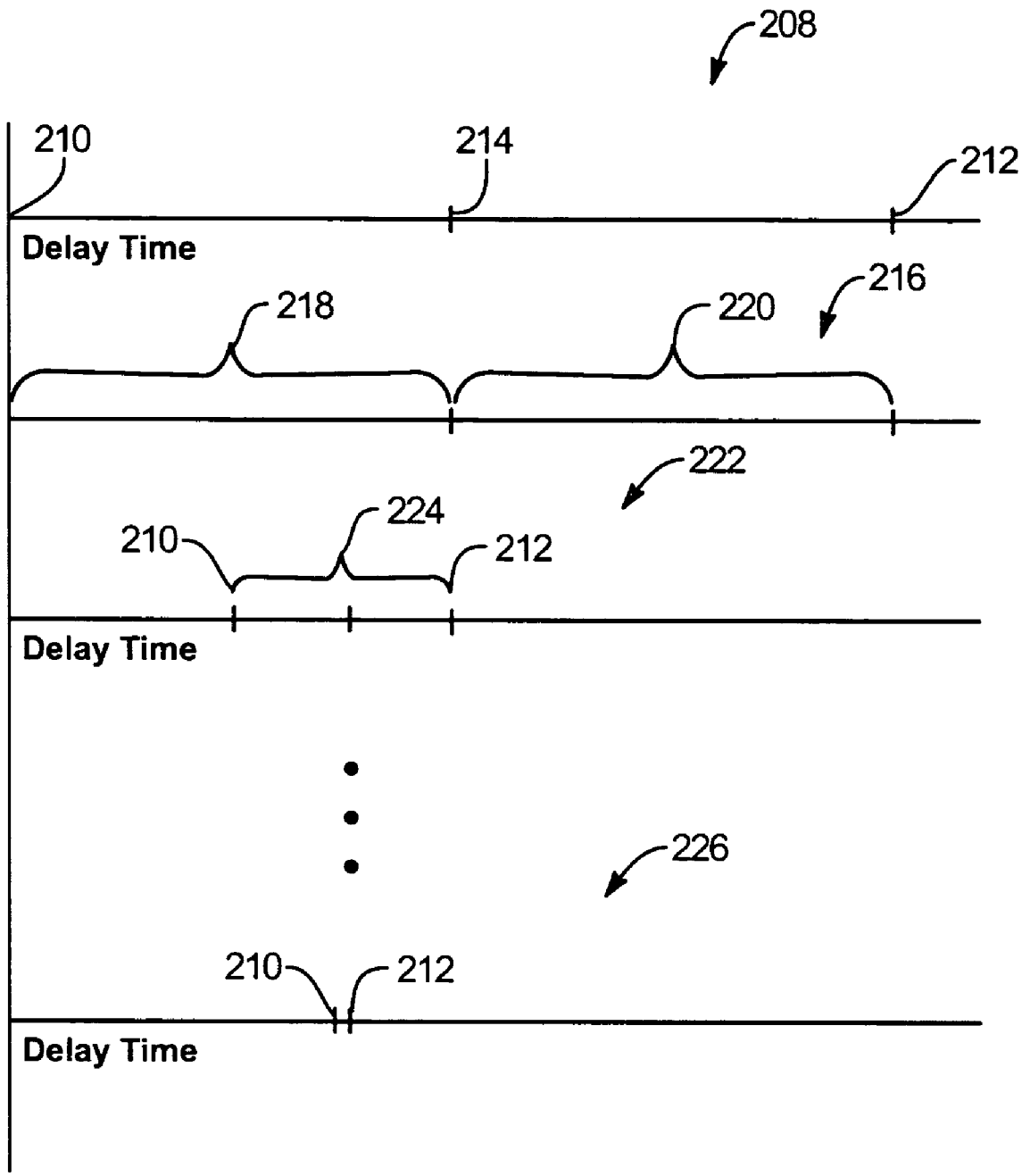
FIG. 9 is a schematic representation of time lines with an indication of delay times used in performing the bisection method, in accordance with the invention.

A method 198 may then be repeated. The boundaries of the search region may be changed based on the results of the test conducted in step 206. Thus if, using the bisection method, an error is not detected and data transfers successfully using the midpoint of the search region, the beginning delay may be set equal to the midpoint and the process may be repeated Referring to FIG. 9, illustrates the bisection search method. Each time line of FIG. 9 represents an iteration 208, 222, 226 of the method. The iteration 208 indicates the starting values for the beginning delay 210, ending delay 212, and test delay 214. An initial delay 212 and maximum delay 214 may bound a test delay 214 located at their midpoint. A test conducted introducing a delay equal to the test delay 214 may or may not indicate that the delay has caused a device 12, 14, 22, 24, 26, 28 to detect an error.

If the test delay 214 of the iteration 208 causes a device 12, 14, 22, 24, 26, 28 to detect an error, then the minimum delay necessary to cause a device 12, 14, 22, 24, 26, 28 to detect an error lies in region 218. Therefore, the iteration 216 will set the ending delay 212 equal to the value of the test delay 214 and leave the beginning value 210 unchanged.

If the test delay 214 of the iteration 208 does not cause a device 12, 14, 22, 24, 26, 28 to detect an error, then the minimum delay must lie in region 220. Therefore, for the iteration 208, the beginning delay 210 is set equal to the test delay 214 of iteration 208 and the ending delay 212 is unchanged.

The iteration 216 will include recalculating the test delay 214 as being the average between the beginning delay 210 and the ending delay 212. Iteration 210 will then include introducing a delay equal to the new test delay 214 into a read or write operation and evaluating whether an error was detected.

Iteration 222 may then repeat the procedure followed in iteration 216, identifying a region 224 that is half the size of regions 218 and 220 in which the critical delay must lie. After many iterations, the process 198 may end at iteration 226 when the beginning delay 210 and ending delay 212 are close enough in value. The process 198 may be stopped where the difference between the beginning delay 210 and ending delay 212 is smaller than some tolerance that may be user defined, hard coded, or determined by some other means. The minimum delay necessary to cause a device 12, 14, 22, 24, 26, 28 to detect an error will be bounded by the final beginning delay 210 and ending delay 212.

It will be noted that at each iteration 208, 216, 222 the method 198 includes determining whether an undetected error has occurred. If an undetected error occurs, a message so indicating may be presented to a user and the process 198 may be stopped.

Figure 10:
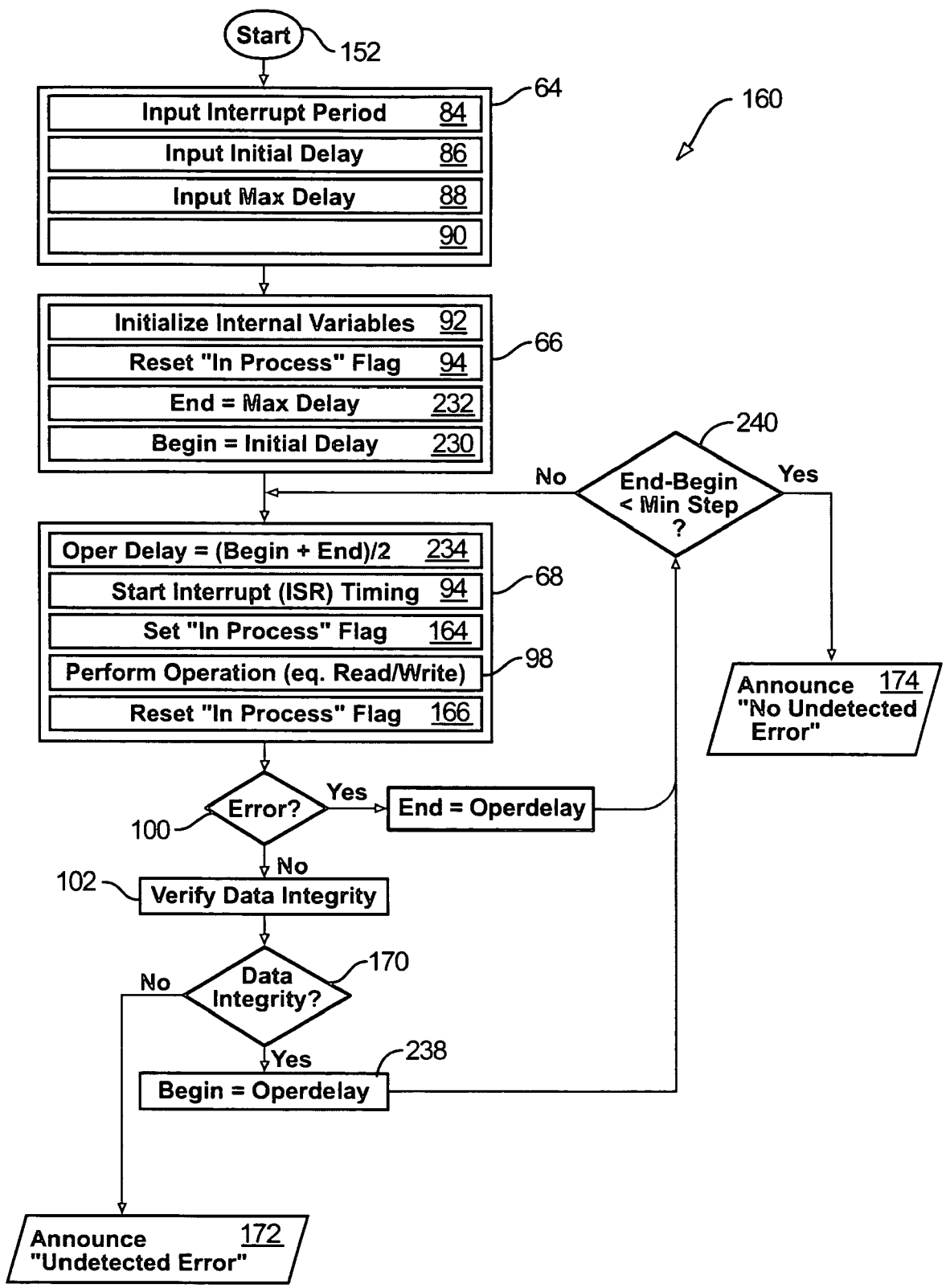
FIG. 10 is a flow chart indicating an alternative embodiment of the algorithm of FIG. 6 using the bisection method, in accordance with the invention.

Referring to FIG. 10, the algorithm executed by the detection module 62 may be modified from the embodiment of FIG. 6 to perform the bisection search method described hereinabove. The initialization module 66 may initialize 230 the beginning delay and initialize 232 the ending delay for the first iteration. The beginning delay may simply be set equal to the initial delay input in step 86 executed by the input module 64. The ending delay may be set equal to the maximum delay input in step 88 executed by the input module 64. The end delay may be also automatically set to be equal to, or some fraction or multiple of, the clock speed of a device 12, 14, 22, 24, 26, 28 being tested. The beginning delay may be also automatically set qual to some fraction or multiple of, the clock speed of a device 12, 14, 22, 24, 26, 28 being tested. The beginning delay may also be set equal to zero. In some embodiments, the method of FIG. 6 may be used to locate an error delay using a large delay step. The end delay may then be set equal to the error delay found before using the bisection method to further refine the minimum error delay.

The operation module 68 may function as in FIG. 6 with the added step 234 of setting the "operation delay" equal to (begin+end)/2. This step sets the "operation delay" equal to the average delay between begin and end.

After the operation module 68 has executed using the midpoint as the operation delay, step 100 may test if an error has been detected. If an error has been detected, the ending delay will be set equal to the operation delay in step 236.

If no error is detected, step 102 may verify whether the data integrity has been preserved. If data integrity is not found, then step 172 is executed, announcing that an undetected error has been found. The process 160 will then end. If data integrity is found, then the beginning delay is set equal to the operation delay in step 238.

Regardless of whether an error is found in step 100, a test 240 may determine whether the difference between the beginning delay and ending delay is less than a variable "minimum step." A minimum step may represent the difference in delay that is essentially irrelevant. That is to say, a change in delay so small that it will have no effect on communication between devices 12, 14, 22, 24, 26, 28 being tested. The minimum step may be user specified, hard coded, or determined based on calculation. The minimum step may be set equal to the duration of one tick of the clock of the faster device 12, 14, 22, 24, 26, 28 involved in the data exchange. The minimum step may be hard coded based on the fastest clock speed of any device 12, 14, 22, 24, 26, 28 being tested in the system. The minimum step may also be set equal to the duration of one tick of the clock of a processor 12.

If the difference between the beginning delay and ending delay is less than the minimum step, then further testing is no longer required and step 174 may announce that no undetected error has been found. If the difference between the beginning delay and ending delay is greater than the minimum step, then the process is executed again, beginning with the operation module 68. A new operation delay will be calculated in step 234 based on the beginning delay and ending delay, one of which will have been changed in the previous iteration.

Figure 11:
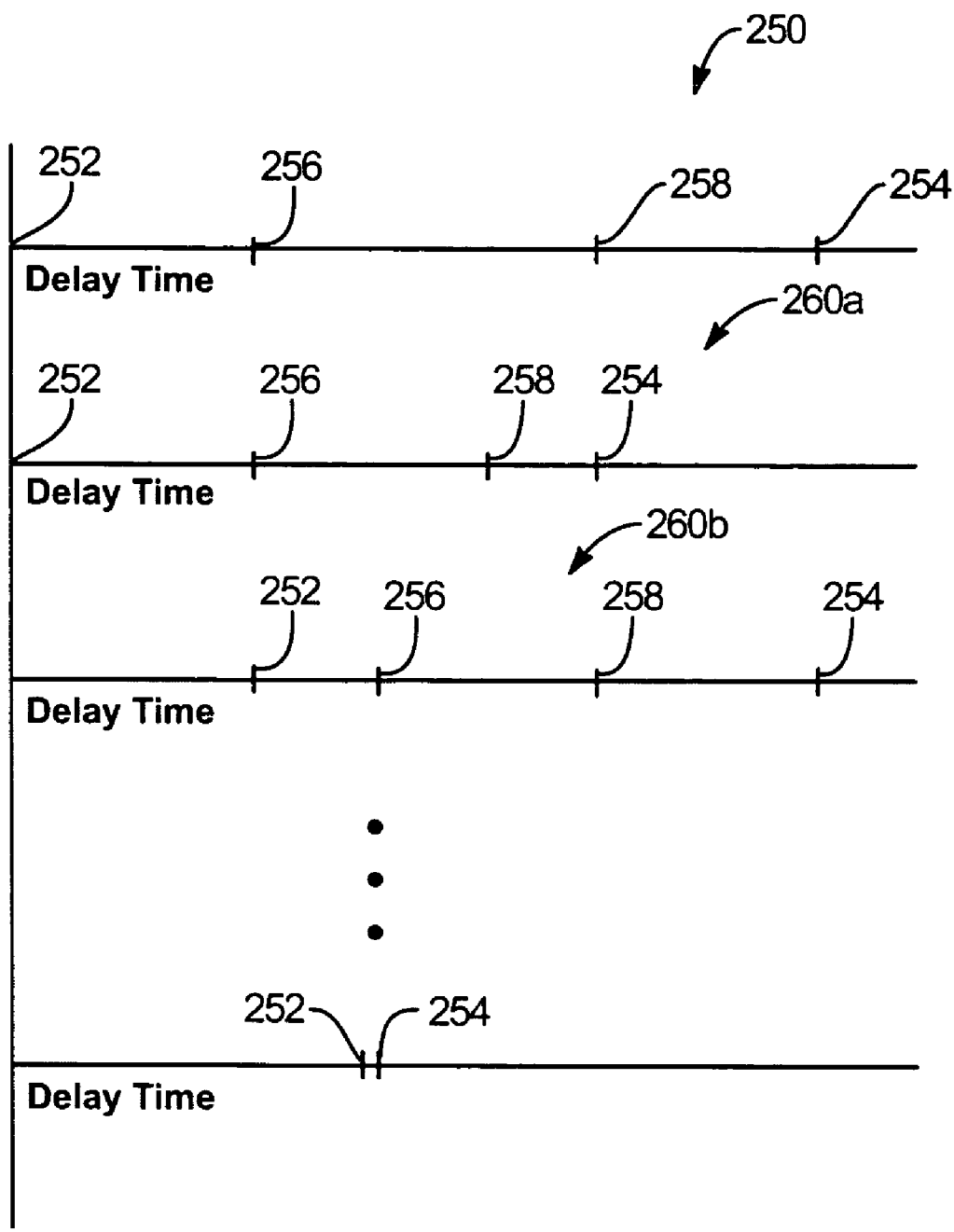
FIG. 11 is a schematic representation of time lines with indications of delay times used in performing the Fibonacci search method, in accordance with the invention.

Referring to FIG. 11, a process 160 may use a Fibonacci search to determine whether undetected errors occur during transfers between devices 12, 14, 22, 24, 26, 28. During a first iteration 250, a beginning delay 252 and ending delay 254 may be specified as described in conjunction with other methods described hereinabove. A first test delay 256 and a second test delay 258 are chosen between the beginning delay 252 and the ending delay 254. The first delay 256 is calculated according to the equation:

first test delay=beginning delay+$[F_{N-2}/F_N]$*[ending delay−beginning delay]

$F_N$ denotes the Nth number in the Fibonacci series which is determined based on the equation $F_N = F_{N-2} + F_{N-1}$ The Fibonacci number for $F_0$ and $F_1$ both equal 1 by definition. Accordingly, Fibonacci numbers 0 through 11 are as follows: 0, 1, 1, 2, 3, 5, 8, 13, 21, 34, 55, 89.

N is determined based on the position of the Fibonacci number that is closest in value of all Fibonacci numbers greater than or equal to [beginning delay−ending delay]/tolerance, with tolerance being the minimum degree of precision needed or desired. Thus, if [beginning delay−ending delay]/tolerance is equal to 14, N would be equal to 8 since $F_8$ is equal to 21, which is closest in value to 14 of all the Fibonacci numbers greater than 14.

The second test delay 258 is calculated according to the equation:

second test delay=ending delay−$[F_{N-2}/F_N]$*[beginning delay−ending delay]

Once a first test delay 256 has been determined, a test may be conducted, introducing a delay equal to the first test delay 256 into a data transfer operation between devices 12, 14, 22, 24, 26, 28 in the manner described hereinabove.

If an error is detected using the first test delay 256 then the ending delay 254 is set equal to the second test delay 258 for the second iteration 260a. The first test delay 256 is set equal to the second test delay 258. A new second test delay 258 is calculated based on the following equation:

$$\text{second test delay} = \text{ending delay} - [F_{N-K-2}/F_{N-K}] * [\text{ending delay} - \text{beginning delay}]$$

The value of K is set equal to the number of the current iteration minus 1. Thus, for the second iteration, K is equal to 1. The second iteration 260a may then include conducting a test using the new first test delay 256.

If an error is not detected using the first test delay 256 during the first iteration 250, then the beginning delay 252 is set equal to the first test delay 256, as shown in second iteration 260b. The first test delay 256 is set equal to the second test delay 258. A new first test delay 256 is then calculated according to the equation:

$$\text{First test delay} = \text{beginning delay} + [F_{N-K-2}/F_{N-K}] * [\text{ending delay} - \text{beginning delay}]$$

The second iteration 260b may then include conducting a test using the new first test delay 256.

The procedure followed in the second iteration 260a, 260b is then repeated so long as K is less than N. When K is equal to N, the beginning delay 252 and ending delay 254 will be less than or equal to the tolerance used to calculate N. The tolerance will typically be the same as, or less than, the "minimum step" discussed hereinabove.

Figure 12A:
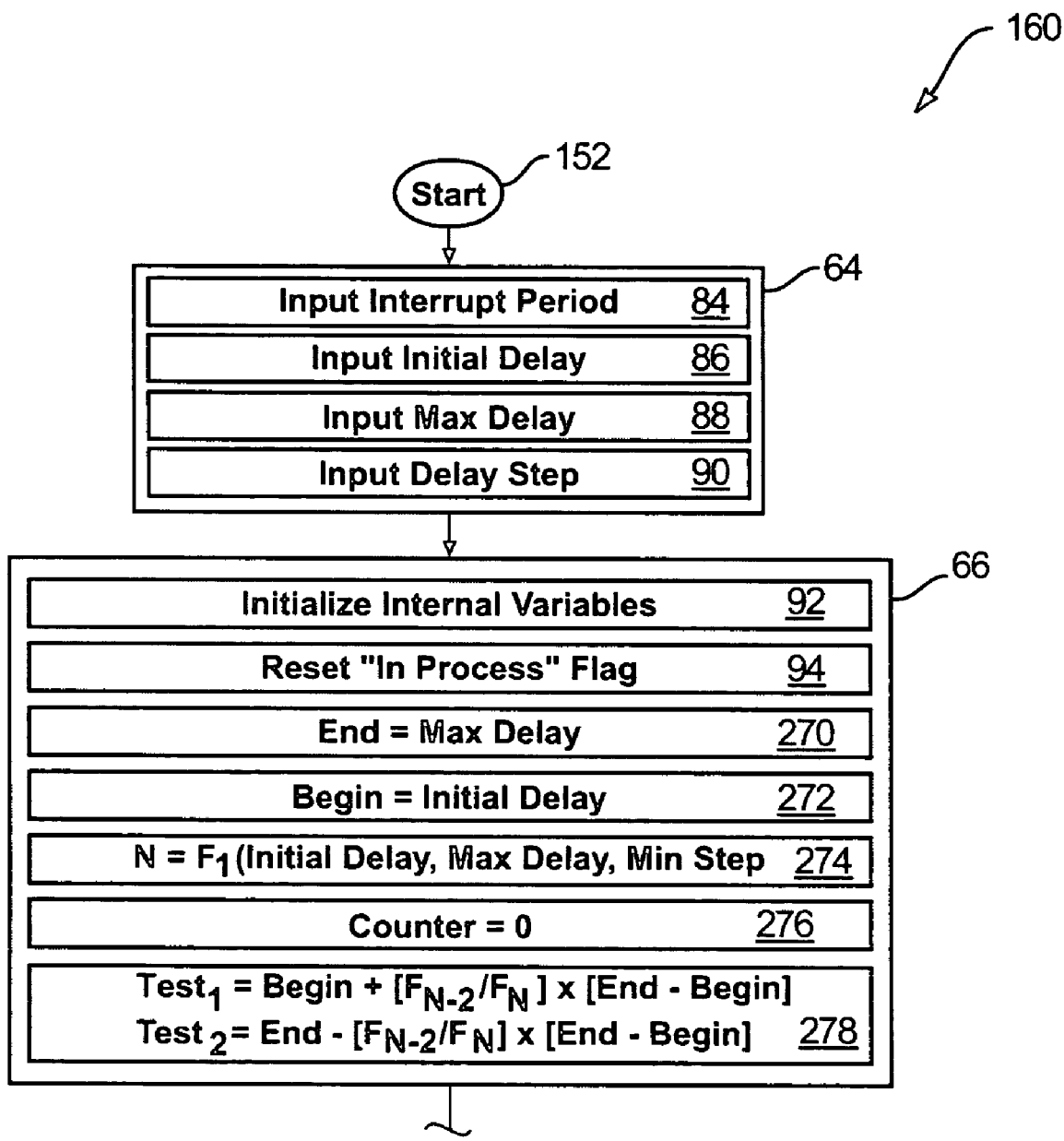
FIGS. 12A and 12B are a flow chart indicating an alternative embodiment of the algorithm of FIG. 6 using the Fibonacci search method in accordance with the invention.
Figure 12B:
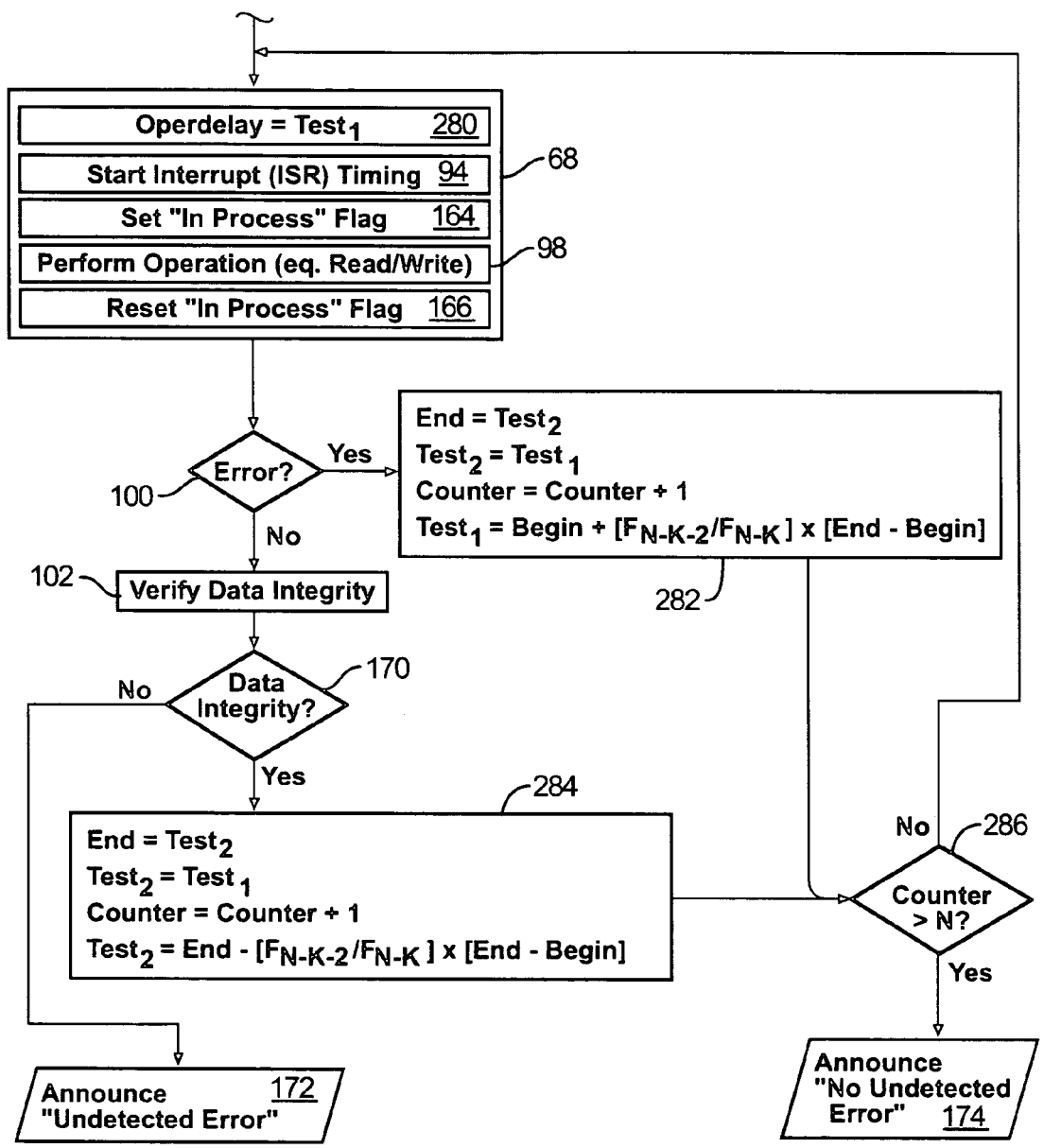

Referring to FIGS. 12A and 12B, the process 160 of FIG. 6 may be modified to perform a Fibonacci search. The input module 64 and initiation or initialization module 66 may function essentially as described hereinabove. The initialization module 66 may also initialize 270 an ending delay labeled "end" and initialize 272 a beginning delay labeled "begin." The initalization module 66 may also calculate 274 the value of the variable N as discussed hereinabove for use in the Fibonacci search. Accordingly, the function F1 may calculate a value of N corresponding to the value of [begin–end]/ minimum step. A counter may be initialized 276 to zero and be used to count the number of iterations. Variables test1 and test2 may also be initialized 278 as illustrated.

The operations module 68 may then execute as discussed hereinabove, except that the operation delay is initialized 280 to be equal to the variable test1. A decision 100 may determine whether operation delay has caused an error. If an error is detected, step 282 may be executed, adjusting the values of end, test1, test2, and counter as illustrated.

If an error has not been detected, step 102 may verify the integrity of the data read or written during the test. A decision 170 may evaluate whether data integrity has been preserved. If data integrity is not found, step 172 may include announcing that an undetected error has occurred, and the process 160 will end. If data integrity is found, then the step 284 may be executed, adjusting the values of begin, test1, test2, and the counter as illustrated.

At some point in each iteration, the counter may be compared 286 to the value of the variable N. If the counter is greater than, or equal to N, then step 174 may announce that no undetected error has been found, and the process 160 will end. If no undetected error is found and the counter is less than N, then the process 160 will repeat, beginning with the execution of the operation module 68.

From the above discussion, it will be appreciated that the present invention provides a dynamic (varying step to step) selection process for incrementing a programmatic time-gap defect detection apparatus and method that identifies false negatives occurring in error detection. These errors may occur due to time delays, and the failures of detection may typically occur due to a mismatch in the minimum time increment or resolution recognized by different processes. Other suitable methods may be similarly used to dynamically alter the delay increment used in the apparatus and method. Thus, simple marching through a domain need not limit the speed and efficiency of identifying a delay increment to assist in finding an undetected error.

The present invention may be embodied in other specific forms without departing from its structures, methods, or other essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed and desired to be secured by United States Letters Patent is:

1. An apparatus for programmatically detecting time-gap defects in a computer system comprising at least two devices interconnected to one another, the apparatus comprising:
   a memory device configured to store data structures comprising executables and operational data;
   a processor operably connected to the memory device to process the data structures;
   a controller configured to control an exchange of data between the at least two devices; and
   the memory device, wherein the data structures further comprise a detection module, executable by the processor and comprising:
      an operation module configured to initiate an exchange of data producing a data stream between the at least two devices;
      an interrupt module configured to interrupt the exchange of data and insert into the exchange of the data stream a delay time value dynamically calculated according to a numerical search method; and
      a verification module configured to determine whether an error occurred as a result of the delay time in the exchange and remained undetected to the computer system.

2. The apparatus of claim 1, wherein the numerical search method is the bisection method.

3. The apparatus of claim 2, wherein the detection module further comprises an initialization module configured to initialize variables, internal to the detection module, with the operating parameters.

4. The apparatus of claim 3, wherein the operating parameters are selected from the group consisting of a maximum delay time value, a minimum delay time value, and the delay time value.

5. The apparatus of claim 4, wherein the interrupt module is further configured to set the delay time value to the average of the maximum delay time value and the minimum delay time value.

6. The apparatus of claim 5, wherein the verification module is further configured to iteratively set the maximum delay time value equal to the delay time value if the delay time value caused a detected error in the exchange, set the minimum delay time value equal to the delay time value if the delay time value did not cause a detected error in the exchange, and set the delay time value equal to the current average of the maximum delay time value and minimum delay time value.

7. The apparatus of claim 6, wherein the verification module is further configured to cease iteration when the difference between the maximum delay time value and the delay time value, the difference between the maximum delay time value and the minimum time value, or the difference between the delay time value and the minimum time value is less than or equal to a minimum value.

8. The apparatus of claim 1, wherein the numerical search method is the Fibonacci search method.

9. The apparatus of claim 8, wherein:
the detection module further comprises an initialization module configured to initialize variables, internal to the detection module, with operating parameters; and
the operating parameters are selected from the group consisting of a maximum delay time value, a minimum delay time value, and the delay time value.

10. An article including a computer readable medium configured to store data structures comprising executables and operational data, the data structures comprising:
a controller driver configured to facilitate an exchange of data between at least two devices in a computer system, and to detect errors occurring in the exchange;
a detection module configured to detect errors originating with the controller driver and yet not detected by the controller driver, the detection module comprising:
an operation module configured to initiate an exchange of data producing a data stream between the at least two devices;
an interrupt module configured to interrupt the exchange of data and insert into the exchange of the data stream a delay time value dynamically calculated according to a numerical search method; and
a verification module configured to determine whether an error occurred as a result of the delay time in the exchange and remained undetected by the controller driver.

11. The article of claim 10, wherein the verification module is further configured to detect a discrepancy between a first device of the at least two devices and a second device of the at least two devices in selection of a timing increment relied upon.

12. A method for programmatically detecting time-gap defects in computer system components, the method comprising:
providing a detection module configured to execute on a processor to initiate errors by introducing time gaps into data streams, detect errors, and verify reporting of errors in data exchanges and operations, controlled by controllers, between devices in a computer system;
loading the detection module onto a computer system comprising a processor, a memory, at least two devices connected to support an exchange of data with one another, and controllers for controlling the exchange; and
executing the detection module by the processor to detect the errors occurring and remaining otherwise undetected by the computer system due to the time gaps.

13. The method of claim 12, wherein executing the detection module further comprises:
effectuating a first exchange of data between the at least two devices in the computer system;
calculating a delay time according to a numerical search method defining a beginning delay and an ending delay;
interrupting the first exchange of data by inserting the delay time therein;
checking the data for any errors incurred by the delay time; and
identifying devices of the at least two devices incurring errors without detection thereof by the at least two devices.

14. The apparatus of claim 13, wherein executing the detection module further comprises reporting, to a user, any errors undetected in the first exchange.

15. The method of claim 14, wherein executing the detection module further comprises re-calculating the delay step according to a numerical search method and executing a second exchange.

16. The method of claim 15, wherein the delay step is re-calculated based on a numerical search method and based on whether the at least two devices detected an error caused by the interrupting of the first exchange of data.

17. The method of claim 16, wherein executing the second exchange further comprises assigning a new value to at least one of the beginning delay and the ending delay according to a numerical search method such that the beginning delay and ending delay are closer in value, and wherein the delay step is calculated according to a numerical search method based on the beginning delay, ending delay, and on whether the at least two devices detected an error caused by the interrupting of the first exchange of data.

18. The method of claim 17, the numerical search method is either a bisection search method or a Fibonacci search method.

19. The method of claim 18, further comprising setting an "in process" flag when the first exchange begins and resetting the "in process" flag when the first exchange ends.

20. The method of claim 19, further comprising re-executing the detection module until the difference in value between the beginning delay and the ending delay is within a minimum delay step value.

* * * * *